United States Patent [19]

Lu

[11] Patent Number: 5,122,695
[45] Date of Patent: Jun. 16, 1992

[54] SCR CONTROL CIRCUITS

[76] Inventor: Chao-Cheng Lu, 4-4, Alley 27, Lane 143, Chun Kung Rd., Taipei 11614, Taiwan

[21] Appl. No.: 384,329

[22] Filed: Jul. 24, 1989

[51] Int. Cl.⁵ ............................................. H03K 17/72
[52] U.S. Cl. ..................................... 307/642; 307/311
[58] Field of Search ....................... 307/630, 642, 311; 363/85, 96, 128, 57; 323/349, 351

[56] References Cited

U.S. PATENT DOCUMENTS 3,938,027 2/1976 Iwamoto .......................... 307/642
4,007,398 2/1977 Nakamura et al. .................. 307/642

*Primary Examiner*—John Zazworsky
*Attorney, Agent, or Firm*—Fleit, Jacobson, Cohn, Price, Holman & Stern

[57] ABSTRACT

A SCR (silicon controlled rectifier) control circuit using two pulses to turn-on and turn-off the SCR, the time of turn-on and turn-off being selectively controlled.

2 Claims, 1 Drawing Sheet

SCR CONTROL CIRCUITS

BACKGROUND OF THE INVENTION

There are several methods heretofore known for operating an SCR. For example, one known method employs a set of power sources directly for SCR turn-off. Disadvantages of this method include potential problems resulting from overcurrent and short circuit from each source; thus the SCR can not perform its turn-off purpose.

SUMMARY OF THE INVENTION

It is a primary object of the present invention to provide a circuit and method for operating a SCR using an electrical energy storage element.

The input circuit of this invention includes a turn-on circuit, a turn-off circuit, a charge-control circuit, and a D.C. source circuit. The turn-on circuit is designed to place the SCR in a turn-on state and to trigger the D.C. source circuit to charge the electric energy storage circuit. The turn-off circuit is designed to place the SCR in a turn-off state when a turn-off pulse is received. The D.C. source circuit is designed to supply electric energy needed by the electrical energy storage element.

The control source of the turn-on circuit may be D.C. voltage, A.C. voltage or pulse voltage so that it can control the turn-on action of the SCR and the charge and turn-off action of the D.C. source with little D.C. voltage, A.C. voltage or pulse voltage.

This invention employs a conventional SCR to serve as a switch.

The charge control circuit of this invention comprises optical couplers and saturated Darlington circuits which are designed to separate the turn-on circuits and charge control circuits so as to prevent the circuits from producing unnecessary interference.

The SCR turn-off circuit of this invention consists of optical couplers and saturated Darlington circuits and are designed to ensure that the electric energy storage circuit has enough electric energy to place the SCR in turn-off state.

The turn-off circuit includes an electric energy storage circuit comprising a capacitor to store electric energy for turn-off of the SCR.

DETAILED DESCRIPTION OF THE PREFERRED EMBODIMENT

Figure 1:
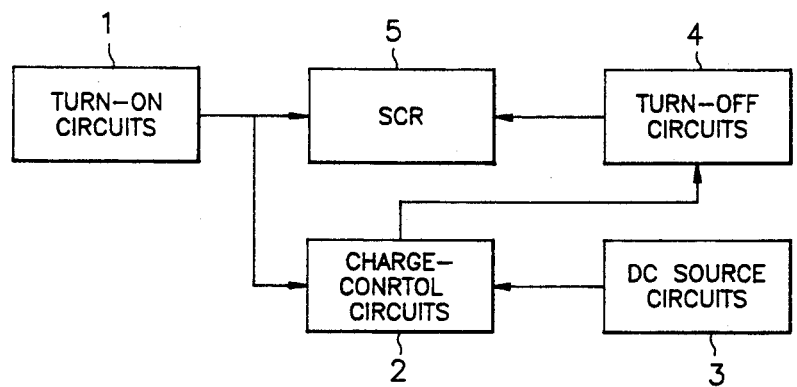
FIG. 1 is a block diagram of the SCR control circuit according to the present invention.

Referring first to FIG. 1, the circuit of the present invention comprises a turn-on circuit 1, a turn-off circuit 4, a charge control circuit 2, and a D.C. source circuit 3. The SCR 5 is controlled by the associated circuits.

FIGS. 2 and 3A to 3C illustrate the structure and operation of the circuit in more detail.

Figure 2:
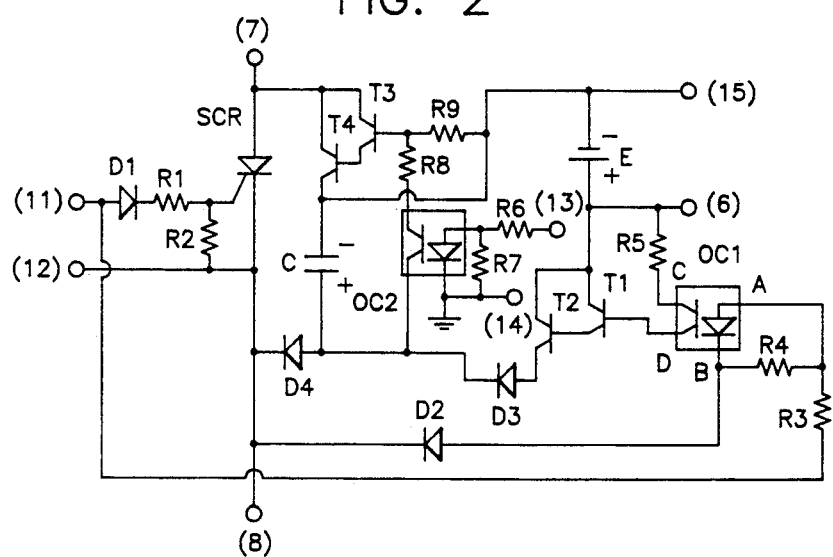
FIG. 2 is a circuit diagram of the SCR control circuits.
Figure 3A:
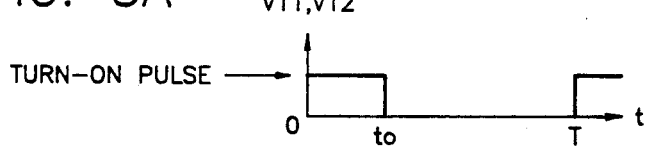
FIGS. 3A to 3C illustrates timing of the turn-on and turn-off of the SCR of the present invention.
Figure 3B:
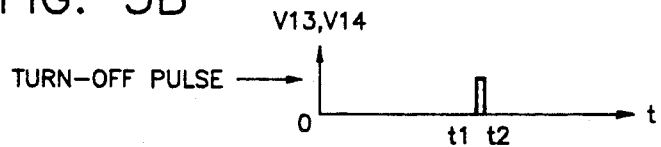
Figure 3C:
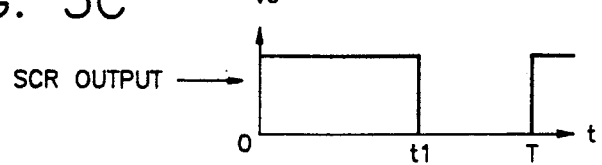

As shown in FIG. 2, when a pulse such as the turn-on pulse as shown in FIG. 3 is applied to terminals 11 and 12, the pulse has two paths. A first path is from diode D1 and resistor R1 to the gate of SCR 5 and then through resistor R2, and the cathode 8 of SCR 5 to terminal 12 forming a turn-on circuit 1 of SCR 5. The second path is from terminal 11 to resistor R3, input terminal A of optical couplers IC (OC1) and resistor R4, then through the input side of optical couplers OC1 to terminal B and the other terminal of resistor R4, through diode D2 to terminal 12 forming the charge control circuit 2. The SCR 5 has an anode 7 and a cathode 8. The diode D1 functions to prevent high voltage emerging at the terminal 11 when the SCR 5 is on. The resistors R1 and R2 serve as voltage divider resistors so that sufficient trigger voltage can be obtained between the gate and cathode of SCR 5. The resistors R3 and R4 serve as voltage divider resistors to place the input side of OC1 in a saturation state. The diode D2 functions to prevent the high voltage returning from the cathode 8 of SCR 5 to the terminal 11 when the SCR is on. When the input pulse of SCR 5 activates the trigger, SCR 5 is on and a voltage is sent from the anode 7 of SCR 5 to the cathode 8 to make SCR 5 in a turn-on state. When the OC1 is on, the output terminal of OC1 is also on. At this time, a positive voltage from the D.C. source E goes through the Darlington circuit consisting of transistors T1 and T2 to diode D3 to charge the capacitor C. The resistor R5 is of an input circuit of the base of transistor T1 for control of the saturation action of transistors T1 and T2. The diode D3 is used to form a one-way circuit so that the positive voltage of D.C. source E can only charge the capacitor C and the negative terminals of capacitor C and terminal E are connected to form a charge circuit.

As shown in FIG. 2, when the turn-off pulse as shown in FIG. 3 is applied to terminals 13 and 14, the input pulse passes the resistors R6 and R7 and the input terminal of the optical coupler OC2 turning OC2 on and placing it in a saturation state. The resistors R7 and R6 serve as input pulse voltage divider resistors of the turn-off circuit 4. When OC2 is on, the positive voltage across the capacitor C passes through the output terminal of OC2 to the Darlington circuit consisting of transistors T3 and T4. At this time, the transistors T3 and T4 are placed in a saturation state and the positive voltage of the capacitor C passed to the diode D4 and the cathode 8 of SCR 5 and to the anode 7 of SCR 5. The emitter of transistor T4 is connected to the negative terminal of capacitor C to form a discharge circuit of the capacitor C. At this moment, SCR 5 is controlled by the inverse voltage of the capacitor C. In other words, the positive voltage of the capacitor C passes via the cathode 8 and anode 7 of SCR 5 and the saturated Darlington circuit of transistors T3 and T4, to the negative terminal of the capacitor C to make inverse voltage discharge and change SCR 5 from a turn-on state to a turn-off state. The resistor R9 is used to keep transistors T3 and T4 grounded and resistor R8 serves as an input resistor of the Darlington circuit consisting of transistors T3 and T4 which form a saturated circuit. The diode D4 has a function of one-way discharge and prevents the high voltage of cathode 8 of SCR 5 from returning to the positive terminal of the capacitor C.

D.C. source circuit 3 comprises a conventional D.C. power supply. When a turn-on pulse is applied, the voltage of terminal E triggers the transistors T1 and T2 of the Darlington circuit to charge the capacitor C, and stops charging when the turn-on pulse is removed.

I claim:

1. An SCR control circuit for controlling the state of operation of an SCR, the circuit comprising:

an SCR having a cathode terminal, an anode terminal and a gate terminal and being capable of operating in a turn-on state and a turn-off state;

a D.C. source;

turn-on means having turn-on input terminals to which is applied a turn-on pulse for placing said SCR in said turn-on state, said turn-on means comprising first voltage dividing means for applying an input turn-on pulse between the gate and cathode terminal of said SCR, a first optical coupler, and a charge control circuit having a second voltage dividing means for applying said input turn-on pulse to an input of said first optical coupler;

an energy storage capacitor having a positive terminal and a negative terminal;

a charging circuit comprising a first Darlington pair circuit being switched on by an output of said first optical coupler to saturation for charging said energy storage capacitor via said D.C. source; and turn-off means comprising a second Darlington pair circuit having a collector which is connected to the anode terminal of said SCR and having an emitter which is connected to the negative terminal of said energy storage capacitor, and a second optical coupler having an input, said second optical coupler responsive to a turn-off pulse applied to the input thereof for switching the second Darlington pair circuit to saturation which in turn connects the charged energy storage capacitor in parallel with the anode and cathode terminals of said SCR.

2. The SCR control circuit of claim 1, and further comprising a diode connected between the positive terminal of said capacitor and the cathode terminal of said SCR.

* * * * *

UNITED STATES PATENT AND TRADEMARK OFFICE
CERTIFICATE OF CORRECTION

PATENT NO. : 5,122,695
DATED : June 16, 1992
INVENTOR(S) : LU CHAO-CHENG It is certified that error appears in the above-identified patent and that said Letters Patent is hereby corrected as shown below:

In the Drawings:
Fig. 2 of the drawings should read --

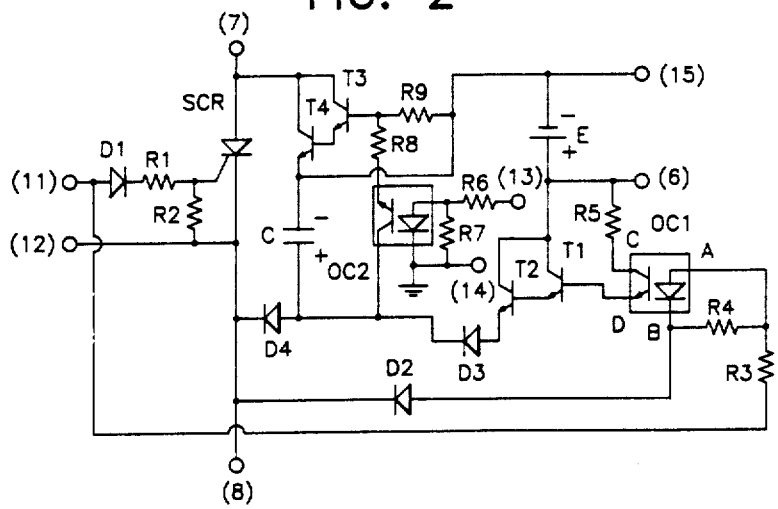

--

Signed and Sealed this

Twenty-third Day of November, 1993

Attest:

BRUCE LEHMAN

Attesting Officer     Commissioner of Patents and Trademarks